(12) United States Patent
Garnett

(10) Patent No.: US 7,129,851 B1
(45) Date of Patent: Oct. 31, 2006

(54) INDICATOR FEEDBACK MECHANISM

(75) Inventor: Paul Jeffrey Garnett, Camberley (GB)

(73) Assignee: Sun Microsystems, Inc., Santa Clara, CA (US)

( * ) Notice: Subject to any disclaimer, the term of this patent is extended or adjusted under 35 U.S.C. 154(b) by 205 days.

(21) Appl. No.: 10/673,696

(22) Filed: Sep. 29, 2003

(51) Int. Cl.
*G09F 9/33* (2006.01)

(52) U.S. Cl. ............. 340/815.4; 340/540; 340/815.42; 340/815.45; 362/551

(58) Field of Classification Search ............. 340/815.4, 340/815.42, 815.45, 540, 635, 3.43; 361/684, 361/685; 369/30.3, 30.92; 362/551, 133; 359/107, 227, 280, 281
See application file for complete search history.

(56) References Cited

U.S. PATENT DOCUMENTS

| | | | |
|---|---|---|---|
| 4,996,655 A | | 2/1991 | Chadwick et al. |
| 5,754,112 A | * | 5/1998 | Novak ......................... 340/635 |
| 5,790,374 A | * | 8/1998 | Wong .......................... 361/685 |
| 6,231,224 B1 | * | 5/2001 | Gamble et al. ............. 362/551 |
| 6,867,701 B1 | * | 3/2005 | Lawrence et al. ........... 340/635 |
| 6,895,183 B1 | * | 5/2005 | Shimomura et al. .......... 398/34 |

* cited by examiner

*Primary Examiner*—Davetta W. Goins
(74) *Attorney, Agent, or Firm*—Meyertons Hood Kivlin Kowert & Goetzel, P.C.; B. Noël Kivlin

(57) ABSTRACT

An indicator assembly for a computer system can comprise a light guide for directing light from an indicator light source to an exterior panel of the computer system. The assembly can also comprise a photodetector configured to receive a portion of the light transmitted by the light guide. The photodetector can produce a signal representative of the portion of the light received. For example, the photodetector may produce a signal representative of the color and/or intensity of the portion of light received. Using the signal representative of the portion of light received, components such as a controller can test for the presence of faults.

24 Claims, 17 Drawing Sheets

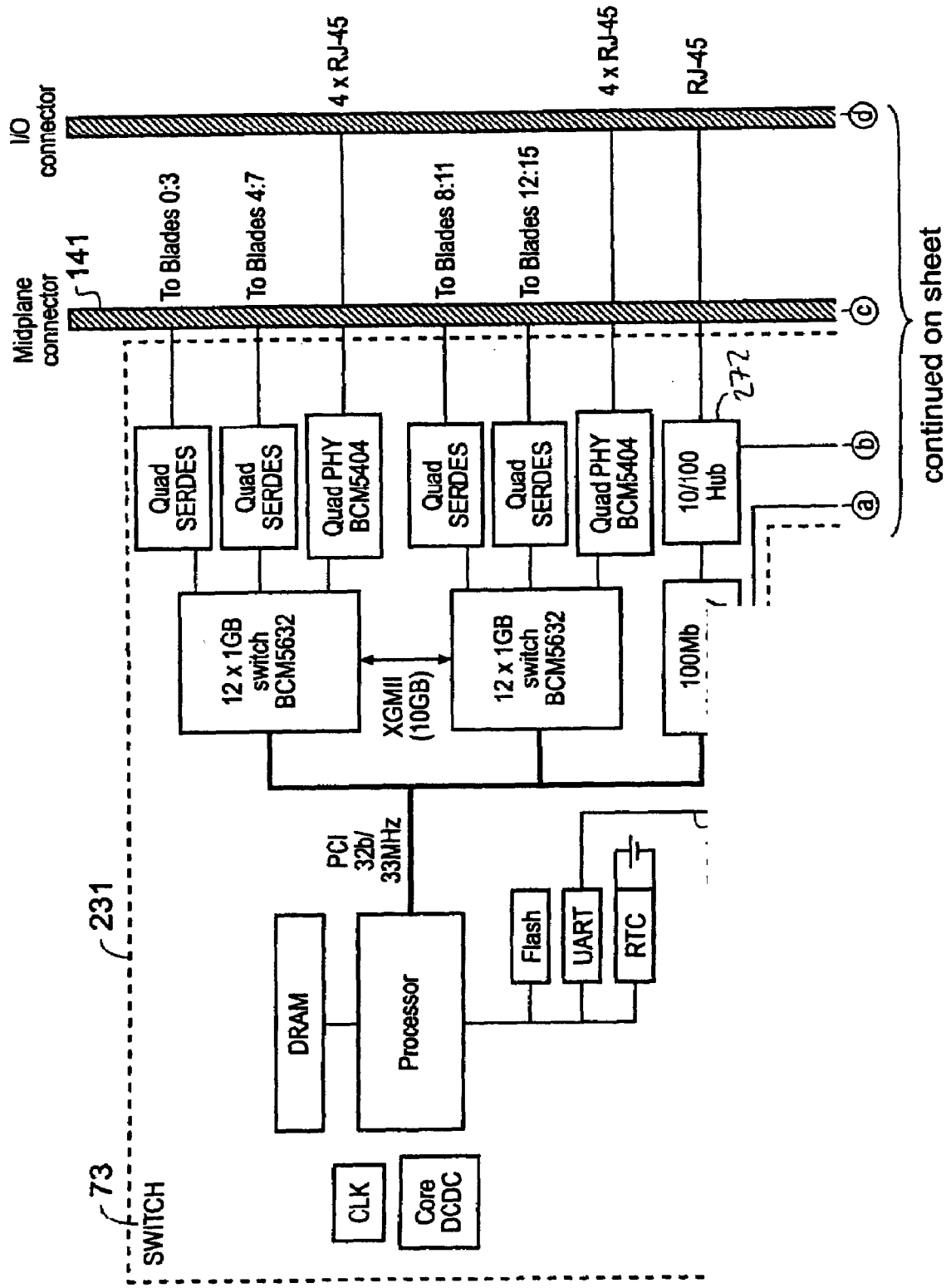

INDICATOR FEEDBACK MECHANISM

BACKGROUND OF THE INVENTION

The present invention relates to indicator lights for computer systems and to testing for faults in an indicator assembly.

It is known to provide one or more indicators in a computer system which serve to indicate a functional state of the system by lighting up (or indeed, by remaining unlit). Typical functional states may include an on/off state, a fault state or an active state (for example whether a hard disk drive is active).

Indicators can comprise a light source and a guide for guiding light away from the light source, for example to the exterior of the computer system so that it is visible to the user. For example, an indicator can comprise a light emitting diode (LED) with a plastic cap. The cap itself may be positioned in an aperture in an exterior housing of a computer system so the user is able to determine whether the LED is lit. In some systems, a separate light guide is used to guide light from the LED to (and through) an exterior panel of the computer system. Such light guides are typically employed when the LED is located remote from the exterior panel.

Indicators are of particular use in computer systems which employ Field Replaceable Units (FRUs). FRUs in computer systems are typically provided in order to increase reliability the of the system by reducing the amount of downtime incurred when faults occur. Since a computer system comprising FRUs is essentially modular, a fault in the system can often be cured by simply replacing the particular FRU which contains the fault.

In computer systems comprising FRUs, indicators can provide an effective way in which functional states of each FRU may be readily ascertained, namely by inspecting the exterior of the FRU. This is particularly true in systems which comprise a large number of FRUs.

In the case of some applications, indicators may spend much of the time unlit. For example, where an indicator is intended to become lit only when a fault in a computer system arises (thereby alerting the user), indicators may only very rarely become lit if such faults seldom develop. Accordingly, a malfunction in the indicator itself may go unnoticed for some time. Additionally, should an indicator develop a fault, then the event or state which it is intended to indicate may go unnoticed or may be falsely determined by the user. For example, an active state may be misread by the user to be an inactive state.

Faults in an indicator may arise for a number of reasons. An LED comprised in the indicator may malfunction for example. Alternatively, a light guide connecting the LED to an exterior panel of the computer system may become loose or be dislodged (this is particularly prone to occurring during assembly of the computer). Where the light guide becomes dislodged, the indicator can fail even though the LED light source remains functional, since light emitted by the LED may not be transmitted to the exterior of the computer housing.

SUMMARY OF THE INVENTION

An aspect of the invention can provide an indicator assembly. The assembly can include a light guide configured to direct light from an indicator light source. The assembly can also include a photodetector configured to receive a portion of the light directed by the light guide to produce a signal representative of the portion of light. The signal can be used to test for faults in the light source and the light guide.

The photodetector may be connectable to a controller to provide the signal to the controller. The controller may thereby test the signal and identify the presence of faults. The assembly may be configured to detect various characteristics of the light directed by the light guide such as wavelength and/or intensity. The assembly may be configured to accommodate more than one light source.

Another aspect of the invention can provide an indicator control apparatus. The apparatus can include a light guide configured to direct light from an indicator light source. The apparatus can also include a photodetector configured to receive a portion of the light directed by the light guide to produce a signal representative of the light. The apparatus can further include a controller configured to receive the signal.

The controller can be operable to determine whether the signal is consistent with the presence of a fault and/or to produce an indication of the fault such as an audible or a visual indication for alerting the user to the presence of the fault.

A further aspect of the invention can provide indicator means. The indicator means can include light guide means for directing light from an indicator light source. The indicator means can also include photodetection means configured to receive a portion of the light directed by the light guide means for producing a signal representative of the portion of light.

Another aspect of the invention can provide a computer system including an indicator assembly. The indicator assembly can include a light guide configured to direct light from an indicator light source. The indicator assembly can also include a photodetector configured to receive a portion of the light directed by the light guide to produce a signal representative of the portion of light.

A further aspect of the invention can provide a circuit board with an indicator light source, a light guide, and a photodetector mounted thereon. The light guide can be configured to direct light from the indicator light source. The photodetector can be configured to receive a portion of the light directed by the light guide to produce a signal representative of the portion of light.

Another aspect of the invention can provide a method for testing for faults in an indicator assembly. The method can include directing light from an indicator light source using a light guide. The method can also include receiving at a photodetector a portion of the light directed by the light guide to produce a signal representative of the portion of light.

The method may be applied in cases where more than one light source is present.

A further aspect of the invention can provide a controller for a computer system. The controller can be operable to assert an activate signal to an indicator light source included in the computer system. The controller can also be operable to receive a signal from a photodetector included in the computer system, wherein the photodetector is configured to receive a portion of light directed by a light guide from the indicator light source and to produce the signal, the signal being representative of the portion of light. The controller can further be operable to determine whether the signal is consistent with the presence of a fault.

Another aspect of the invention can provide a computer program product, the computer program product including program instructions for controlling a processor to perform a number of steps. These steps can include asserting an activate signal to an indicator light source. Another step can include receiving a signal from a photodetector, wherein the photodetector is configured to receive a portion of light directed by a light guide from the indicator light source and to produce the signal, the signal being representative of the portion of light. A further step can include determining whether the signal is consistent with the presence of a fault.

A computer program product for implementing the invention can be in the form of a computer program on a carrier medium. The carrier medium could be a storage medium, such as a solid state, magnetic, optical, magneto-optical or other storage medium. The carrier medium could be a transmission medium such as broadcast, telephonic, computer network, wired, wireless, electrical, electromagnetic, optical or indeed any other transmission medium.

BRIEF DESCRIPTION OF THE DRAWINGS

Embodiments of the present invention will be described hereinafter, by way of example only, with reference to the accompanying drawings in which like reference signs relate to like elements and in which.

Figure 1:
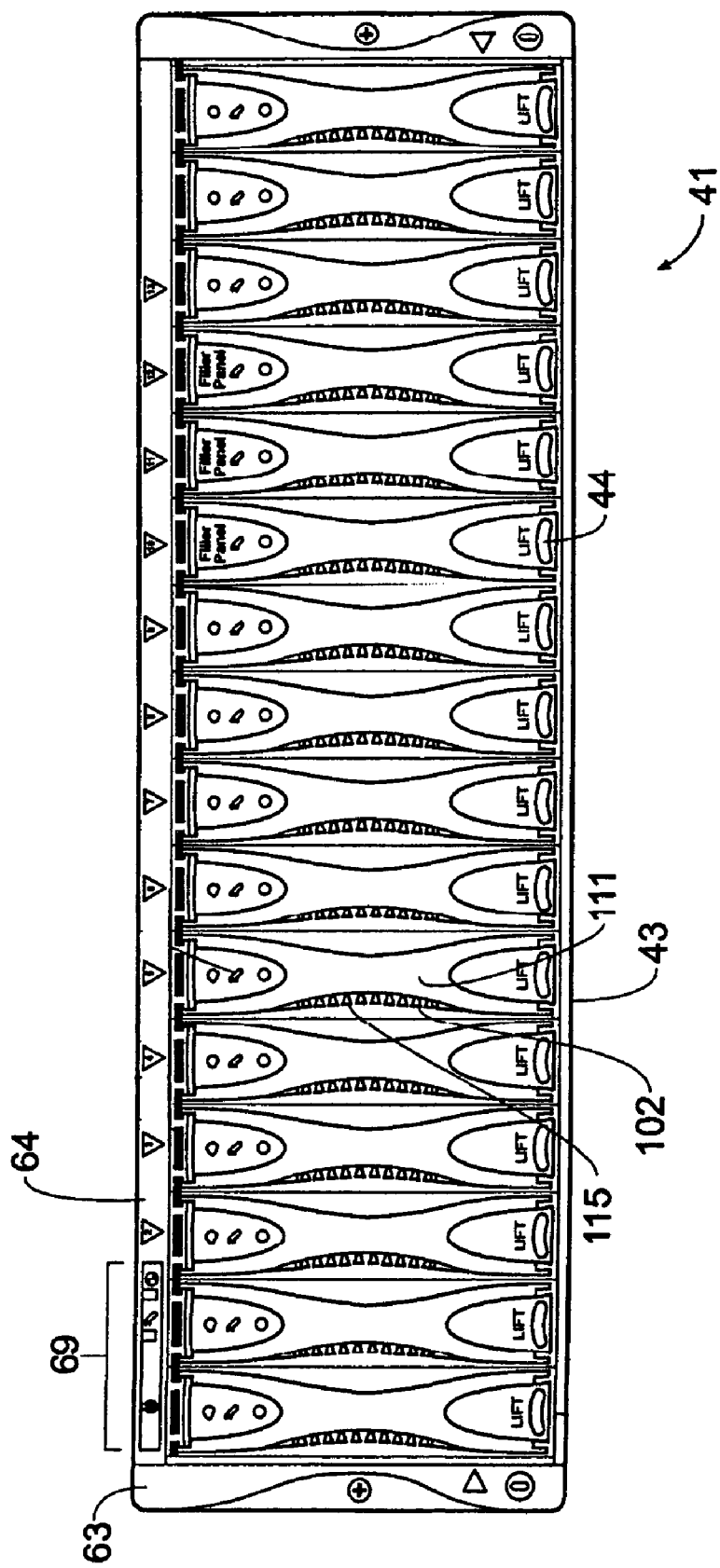
FIG. 1 is a front view of an example of a shelf in a rack mountable computer systems comprising field replaceable units.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims. In this regard, combinations of features from the independent claims with features of dependent claims other than as presented by the dependencies of the claims, and also with features from the description, are envisaged.

DESCRIPTION OF PARTICULAR EMBODIMENTS

Embodiments and examples are described hereafter by way of example only in the following with reference to the accompanying drawings.

FIG. 1 is a front view of a shelf 41 comprised in a rack mountable computer system. A plastic front bezel 63 can be provided that fits on the front face of the shelf. The front bezel 63 could include a number of separate components, or mouldings. The front bezel can include a peripheral portion 64 that can provide areas for corporate and product branding marks, for identification and numbering for the information processing cartridge and for a bar code label (all not shown). Where no active module is mounted in a location for an information processing module, a blanking panel, or filler panel, such as the blanking panel 44, can be located in that location. Indicators lights 69 such as LEDs can be mounted behind a designated area of the bezel to provide an indication of system status via light guides. A further system indicator assembly accommodating indicator lights can be provided inside the shelf enclosure to be visible from the rear thereof (see FIG. 2).

In the present example of a shelf, up to sixteen information processing cartridges 43 can be installed in respective openings 45 in the front face 57. The number of information processing cartridges 43 actually installed in any installation is dependent upon the system configuration required.

Figure 2:
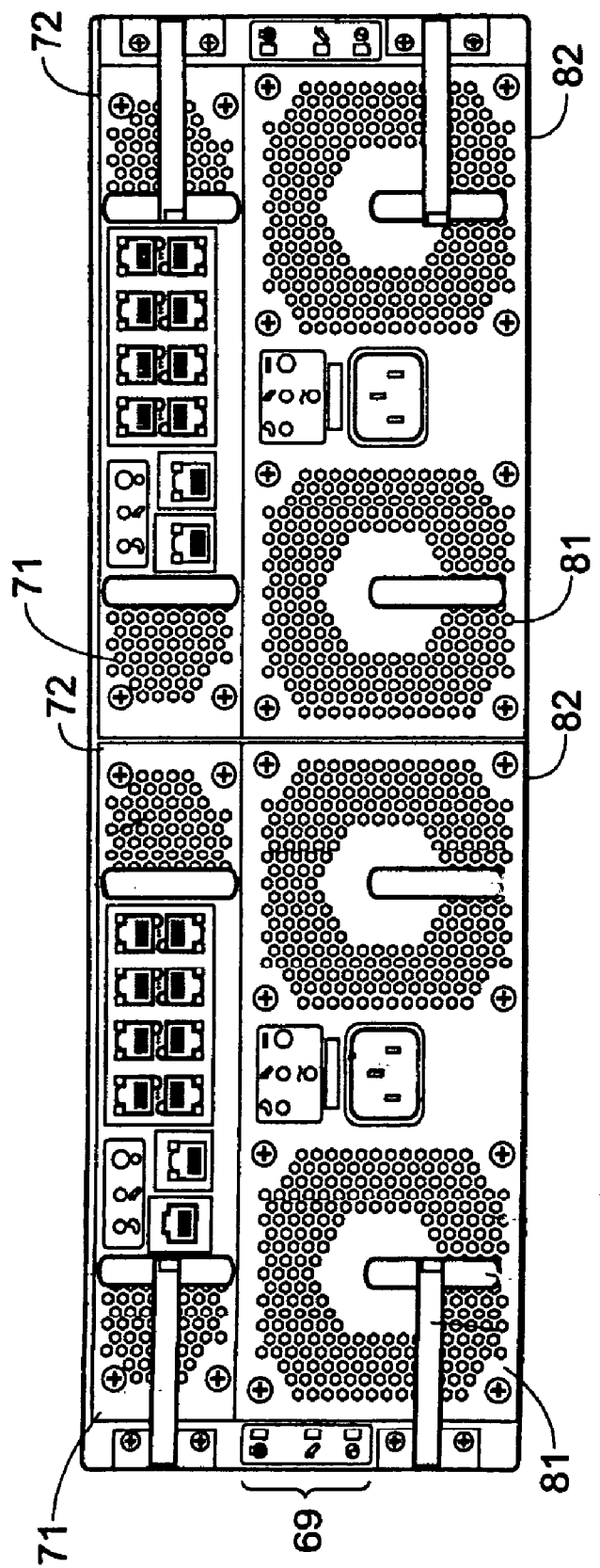
FIG. 2 is a rear view of an example of the shelf of FIG. 1.

FIG. 2 illustrates the rear of the shelf unit of FIG. 1. This shows two different types of FRU 71 and 81 (4 units in total) that have been inserted into respective apertures 72 and 82 in the rear of the shelf. The FRUs shown in FIG. 2 include two Combined Switch and Service Processors (CSSPs) 71 and two Power Supply Units (PSUs) 81. Indicator lights 69 such as LEDs can be mounted behind one side of the rear of the shelf unit in the present instance. Light guides can direct light from the LEDs to provide an indication of system status at the rear of the shelf.

Figure 3:
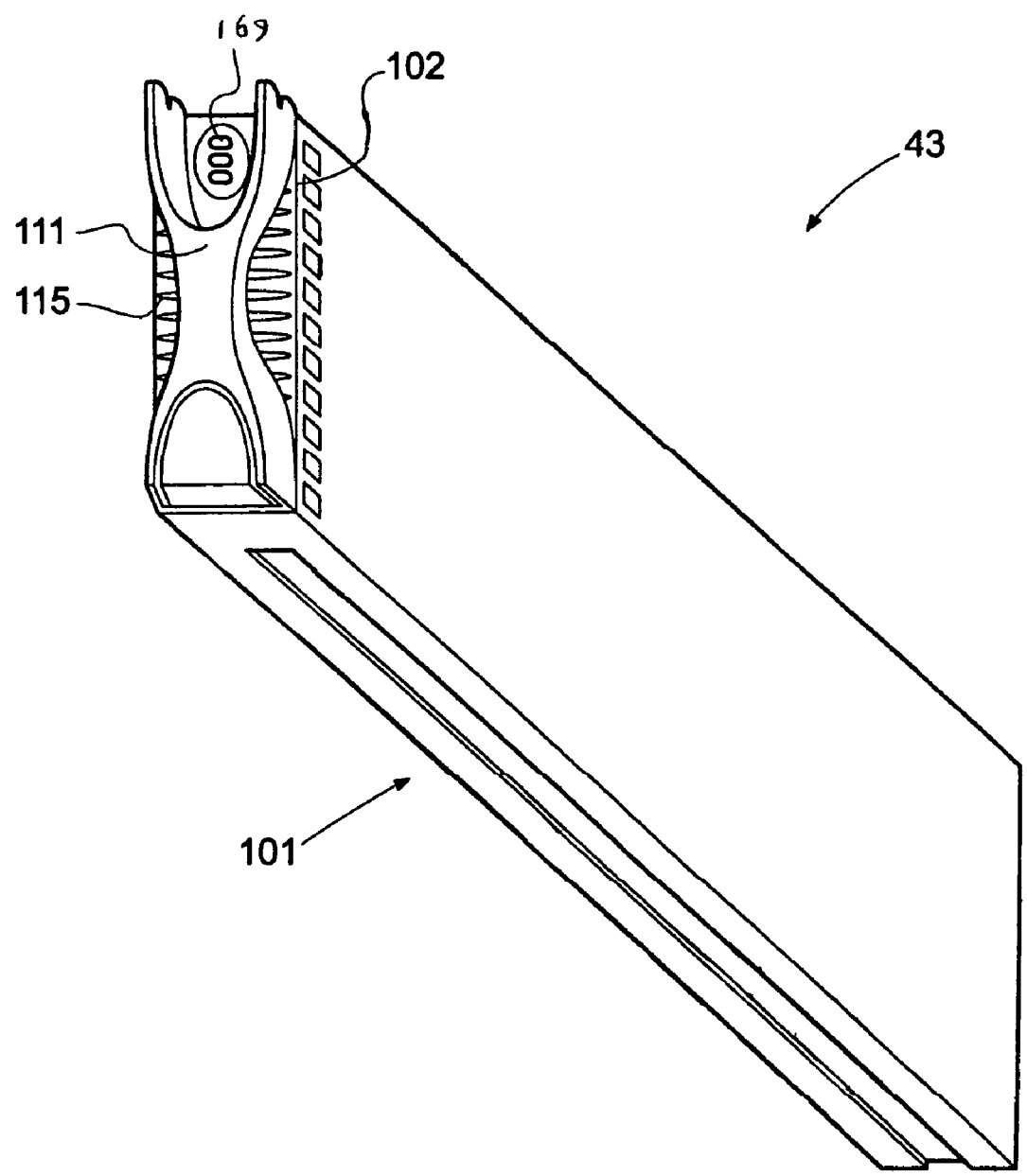
FIG. 3 is a schematic perspective view of an example of an information processing cartridge mountable in the shelf of FIGS. 1 and 2.

FIG. 3 provides a perspective view, partly from the front of an information processing cartridge 43.

Each of the information processing cartridges contains at least one processor. Each information processing cartridge in the present example is operable as a server. In the described examples, the information processing cartridges are configured as robust enclosed modules.

The provision of the enclosure 101 means that the information processing cartridge 43 can safely be handled by an operator who is not a skilled technician. Also, through the use of the enclosure 101, the information processing cartridge is a robust unit that protects its inner workings from the outside environment and vice versa. The use of a conductive enclosure, e.g., a metal enclosure, can result in the information processing cartridge including its own electromagnetic shielding. To this end, the enclosure 101 can also be provided with an internal electromagnetic interference (EMI) shielding.

As shown in FIGS. 1 and 3, the information processing cartridge 43 incorporates an injector/ejector handle 111 on the front face 102 for facilitating insertion and latching of the information processing cartridge 43 within an aperture in the shelf 41. The handle 111 of the injector/ejector lever extends substantially the whole height of the front face of the information processing cartridge 43, thereby increasing the mechanical advantage and facilitating injection and ejection of the information processing cartridge 43. The front face 102 of the information processing cartridge 43 has perforations 115, in the present example slits, to allow for airflow into the information processing cartridge 43. It will be noted in FIGS. 1 and 3 that the handle 111 is narrower in its middle than at its ends. This reduces any masking effect of the handle 111 on the airflow to the perforations 115 in the front face of the information processing cartridge 43 and facilitates grasping of handle 111.

The information processing cartridge 43 can also comprise indicators lights 169 such as LED indicators for indicating functional states of the cartridge to the user.

Figure 4:
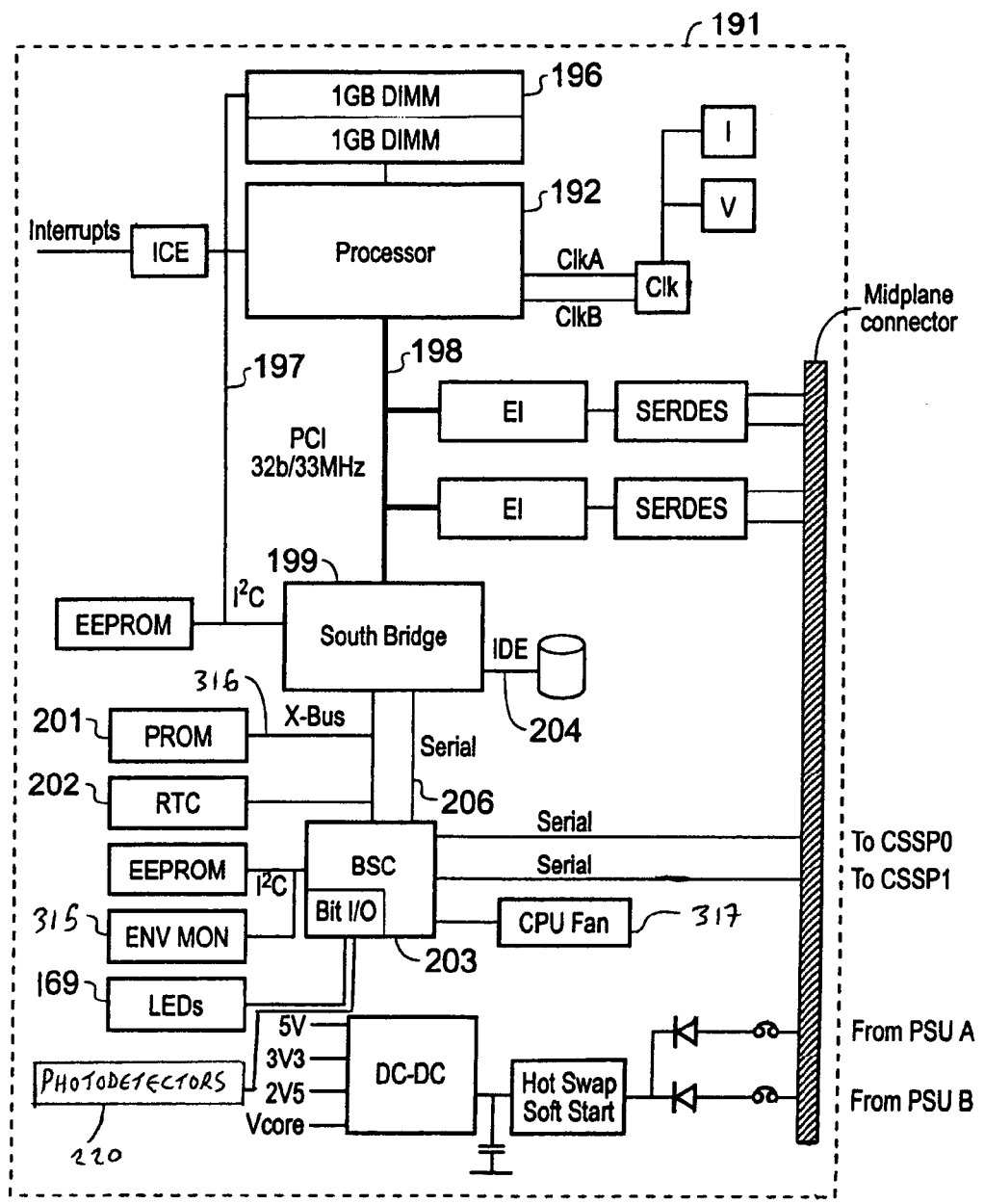
FIG. 4 is a schematic example of the functional elements of an information processing cartridge such as that shown in FIG. 3.

With reference to FIG. 4, there now follows a description of functional elements of an example of an information processing cartridge 43 as contained within the information processing cartridge enclosure 101.

The information processing cartridge 43 includes a microprocessor 192 (a non-limiting example of a microprocessor that can be utilised in the present example is an UltraSPARC™ processor). The microprocessor is mounted on an information processing cartridge motherboard 191.

In the present example, memory means for use by the processor 192 when executing instructions can be provided in the form of buffered dynamic random access memory (DRAM), for example configured as dual in line memory modules (DIMMS) 196.

In the present example, a PCI bus architecture can be employed with a so-called SouthBridge bus bridge 199 with SuperIO and two Gb Ethernet Media Access Control (MAC) devices. Other bus protocols (e.g., Infiniband) can be used. A 32 bit PCI bus 198 can be provided from the microprocessor 192. The SouthBridge 199 is a standard form of bus bridge. It can for example provide the following functions: an SM Bus interface over an I2C bus 197 for access to a SPD (Serial Presence Detect) feature of the DIMMs that allows initialization of the memory controller; an Xbus interface for access via an Xbus 316 (which is a packet switched multiprocessor bus) to a PROM 201, a real time clock (RTC) 202 and an information processing cartridge service controller (hereinafter termed a Blade Service Controller (BSC)) 203; an IDE (Integrated Drive Electronics) interface that provides an ATA-100 (AT Attachment) IDE connection 304 to an IDE disk drive 205; and a serial console interface on a service bus 206 to the BSC 203 that is used for operating system functions including a console function.

In the present implementation, the BSC 203 can be implemented as a microcontroller (e.g., a Hitachi H8 microcontroller). The BSC 203 can provide various functions, including for example: dual access (for the information processing cartridges and the CSSPs 71) to PROM 201 and EEPROM 213 for boot information and a FRU-ID for the information processing cartridge; channelling communication between an information processing cartridge 43 and the service processor part of the CSSPs 71; control of power on reset (POR), system reset and externally initiated reset (XIR) to the microprocessor 192; control of the power, service-required and LED indicators 69; upgrading of field-upgradable firmware, via the serial interface; a watchdog function for the operating system; monitoring the speed of a CPU fan 317; and communications with an EEPROM 315 and the operating system via the Xbus 316. The BSC 203 may also control and monitor the operation of LED indicators 169 comprised in the information processing cartridge 43. The BSC 203 may also be configured to receive signals from one or more photodetectors 220 which may also be comprised in the information processing cartridge 43. As described below, the BSC 203 may be operable to perform tests upon the LEDs 169 which may include determining from signals received from the photodetector/s 220 whether a fault is present.

In the present example, the BSC 203 can be powered by a 5V standby rail as soon as a CSSP 71 and a PSU 81 are fully inserted into the midplane 171, it then turns on other DC/DC converters to provide power to the remainder of the information processing cartridge 43. A BSC reset signal can be derived from a simple conventional power on reset (POR) generator that monitors a 5V supply rail.

Figure 6:
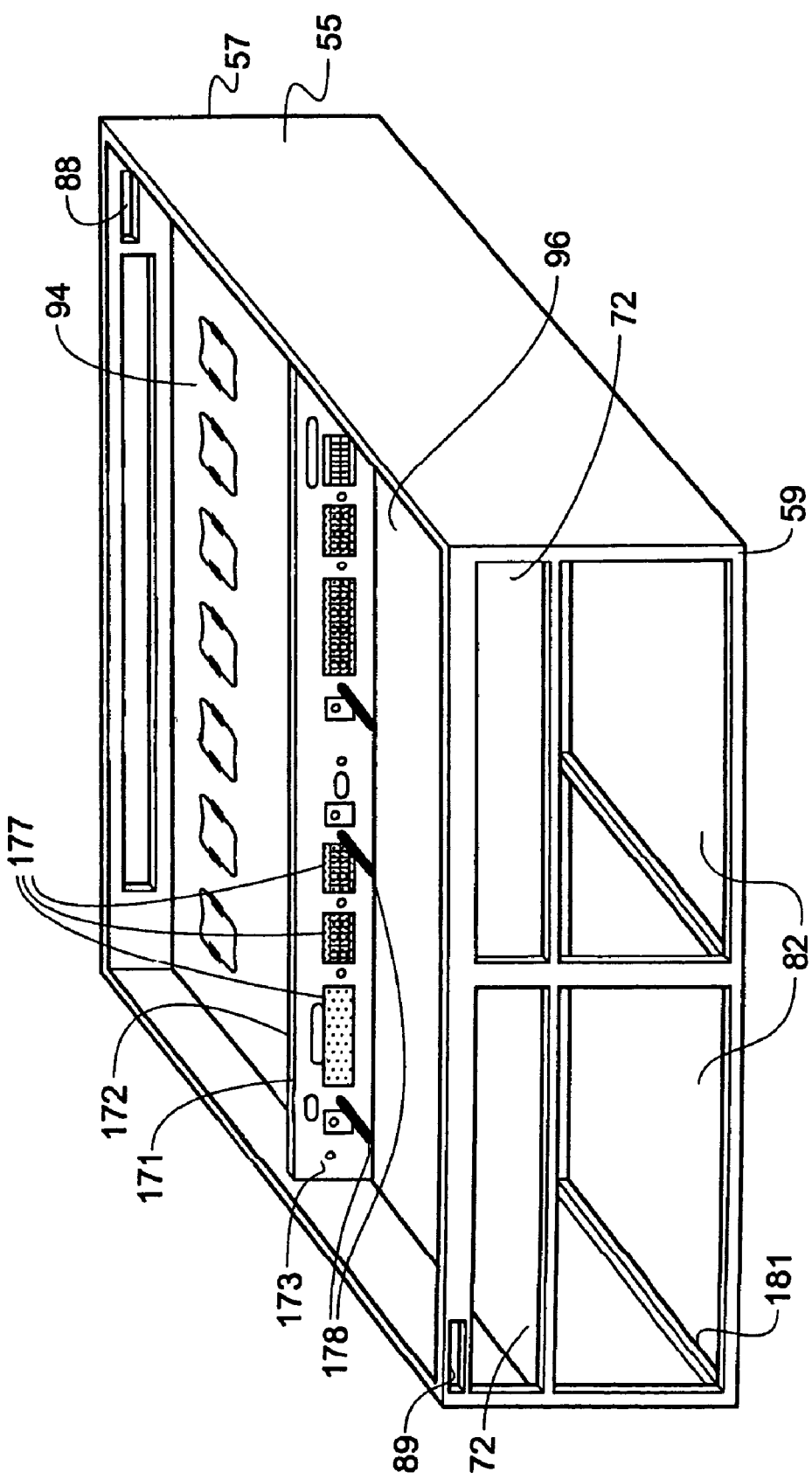
Figure 7:
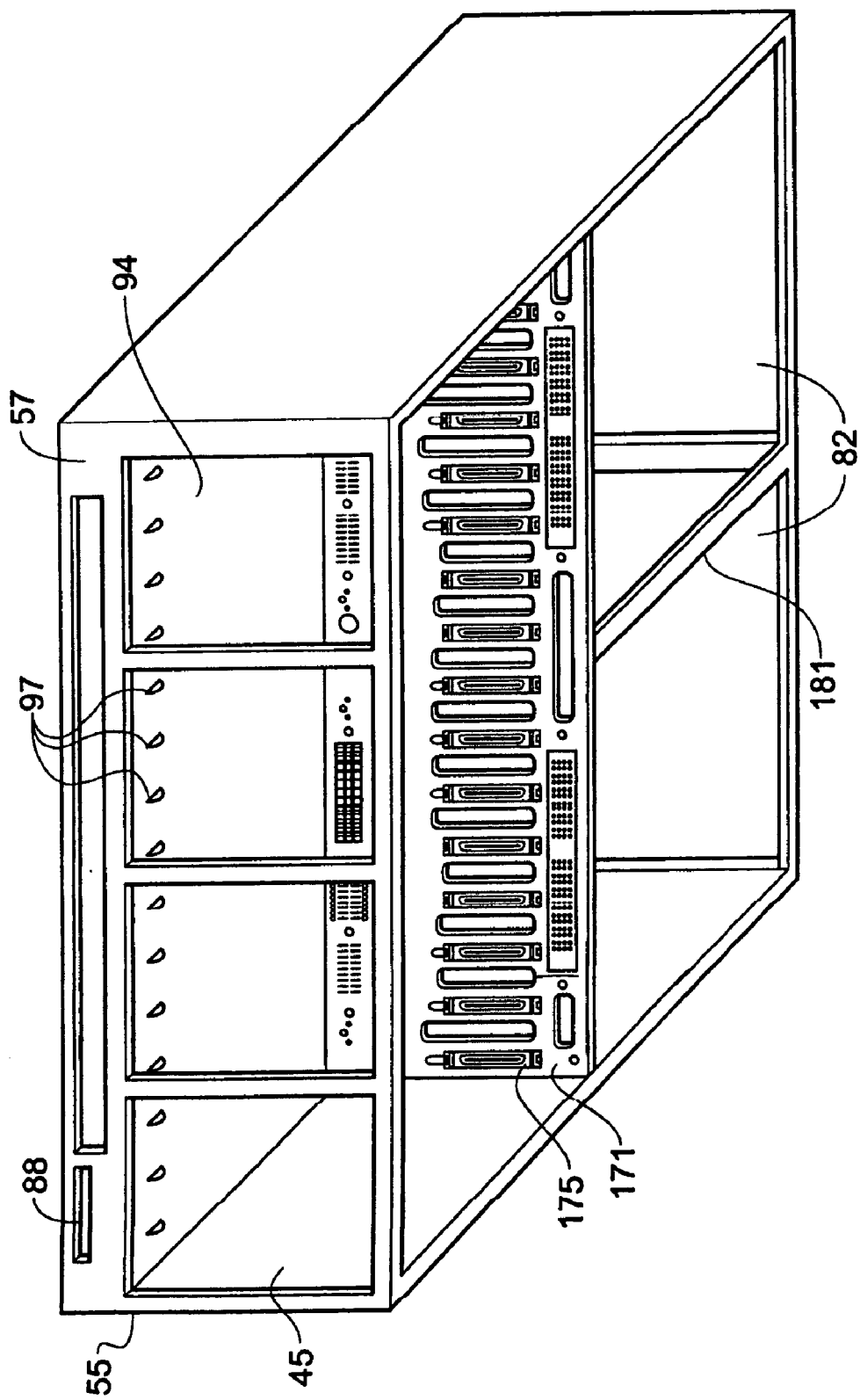

The internal configuration of the shelf 41 and a midplane 171 contained therein is described in the following with reference to FIGS. 5, 6 and 7.

Figure 5:
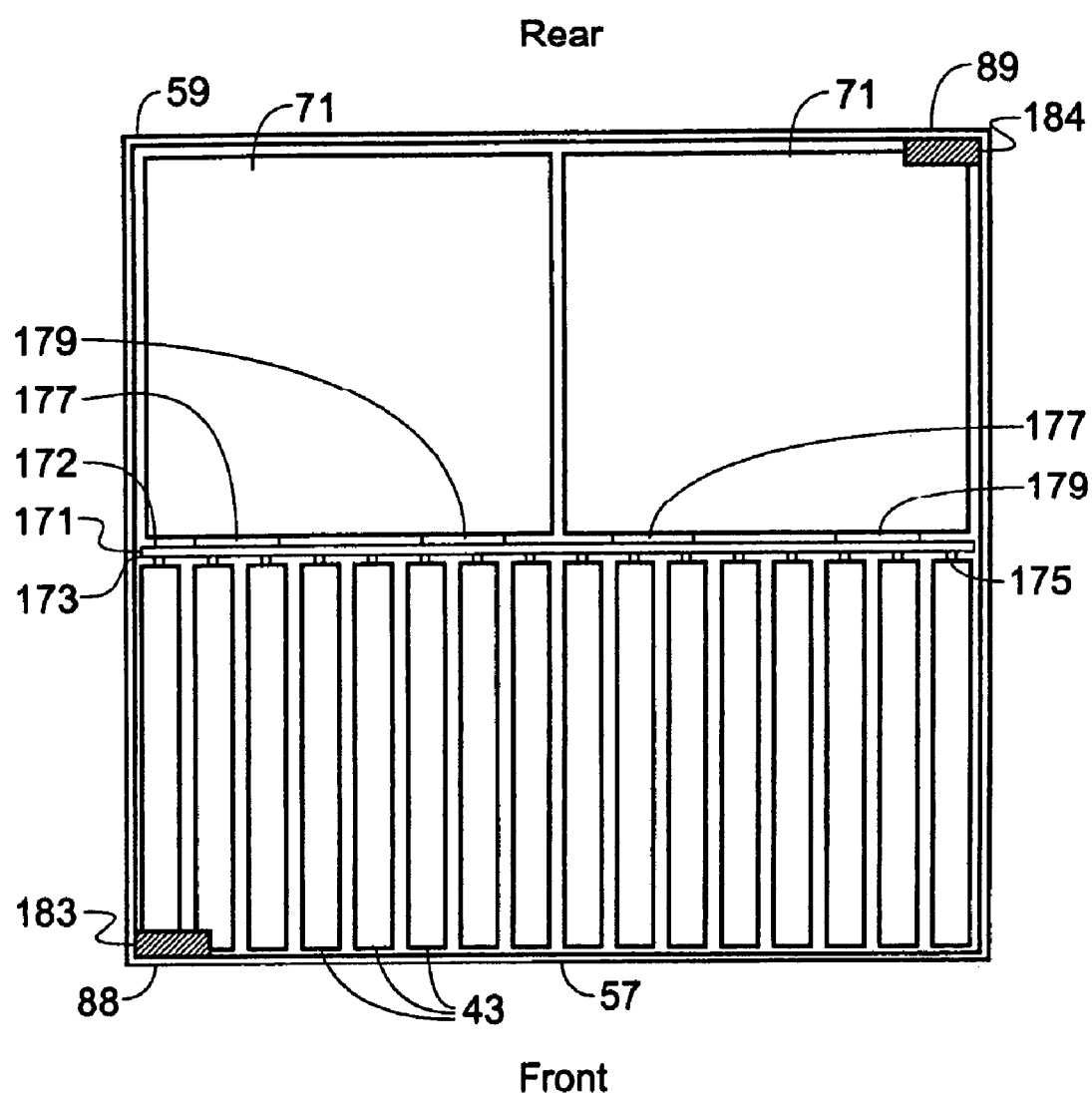
FIGS. 5, 6 and 7 are a schematic plan view and schematic perspective views, respectively, of an example of the chassis and midplane of a shelf in which the information processing cartridge of FIG. 1 may be mounted.

FIG. 5 is a schematic interior plan view of the shelf. FIG. 6 is a schematic perspective view from above the rear of the chassis portion 47 of the shelf enclosure with the field replaceable units removed. FIG. 7 is a schematic perspective view from below the front of the chassis portion 47 of the shelf enclosure with the field replaceable units and the base 51 removed.

The vertically mounted midplane 171 extends, across the shelf 41 and allows for the electrical interconnection of the FRUs. The various apertures in the front and rear faces 57 and 59 of the shelf 41, in combination with the midplane 171, can be provided with guides (e.g., rails 181) and keying e.g., offset connector positioning for the insertion of the FRUs into the enclosure and midplane 171. The midplane 171 can be a double-sided, or multi-layer printed circuit board (PCB) assembly that can be mounted vertically in a rigid manner within the enclosure. It can carry connectors 175 on a front surface 172 for making electrical connection with corresponding connectors on the information processing cartridges 43. It can also carry connectors 177 and 179 on rear surface 173 for making electrical connection with corresponding connectors on the CSSPs 71 and the PSUs 81. Conductive tracks (not shown) on and through the midplane 171 can be provided to interconnect the various connectors. In addition, the midplane can provide connectors for receiving corresponding connectors connected to first and second indicator assemblies 183 and 184 that each accommodate a respective set of LED indicators 69. In the present example, the midplane 171 is not configured as a FRU and is not hot swappable.

A plurality of cartridge guides 97 can be provided at the underside of the plenum chamber floor member 94.

A CSSP/PSU divider 96 can be provided to the rear of the midplane 171 and can extend horizontally to the rear face 59 of the shelf enclosure 47. The CSSPs 71, when inserted, are supported by the divider 96. To aid the correct insertion of the CSSPs 71, CSSP guide pins 178 are provided on the midplane 171 at positions adjacent connectors 177 on the midplane 171 for connection to the CSSPs 71.

Respective positions 88 and 89 can be formed in the front face 57 and the rear face 59 at which first and second indicator assemblies 183 and 184 accommodating the indicator LEDs 69 can be located. These positions 88, 89 therefore include an aperture or apertures through the respective exterior panel of the shelf enclosure 47 such that indicator LEDs may be viewed from outside the shelf enclosure.

The midplane supports a number of paths for various power and signal lines to interconnect the FRUs.

Also, each PSU 81 has a management signal connection (e.g., a serial I2C (Inter-IC Bus) connection) to the CSSP cartridge 71 to control power and monitor environmental parameters. The I2C bus comprises of two signals SCL and SDL (serial clock line and serial data line). In addition, an I2C address programming pin is provided for the PSUs 81.

In the present implementation, indicator assemblies 183 and 184 (see FIG. 5) are provided at the front and rear of the system. The indicator assemblies can be configured as FRUs. In this example they accommodate three system-level indicator LEDs and can include a FRU identity (FRU-ID) programmable read-only memory (PROM) each. Various LED indicators can be provided. There can, for example, be a white locator LED that can be switched by the user for locating the system; a green power-on LED to indicate when the system is powered; and an amber service-required LED to indicate a fault or other condition requiring servicing. These LEDs and components of the indicator assembly can be driven by either of the CSSPs 71.

Figure 8:
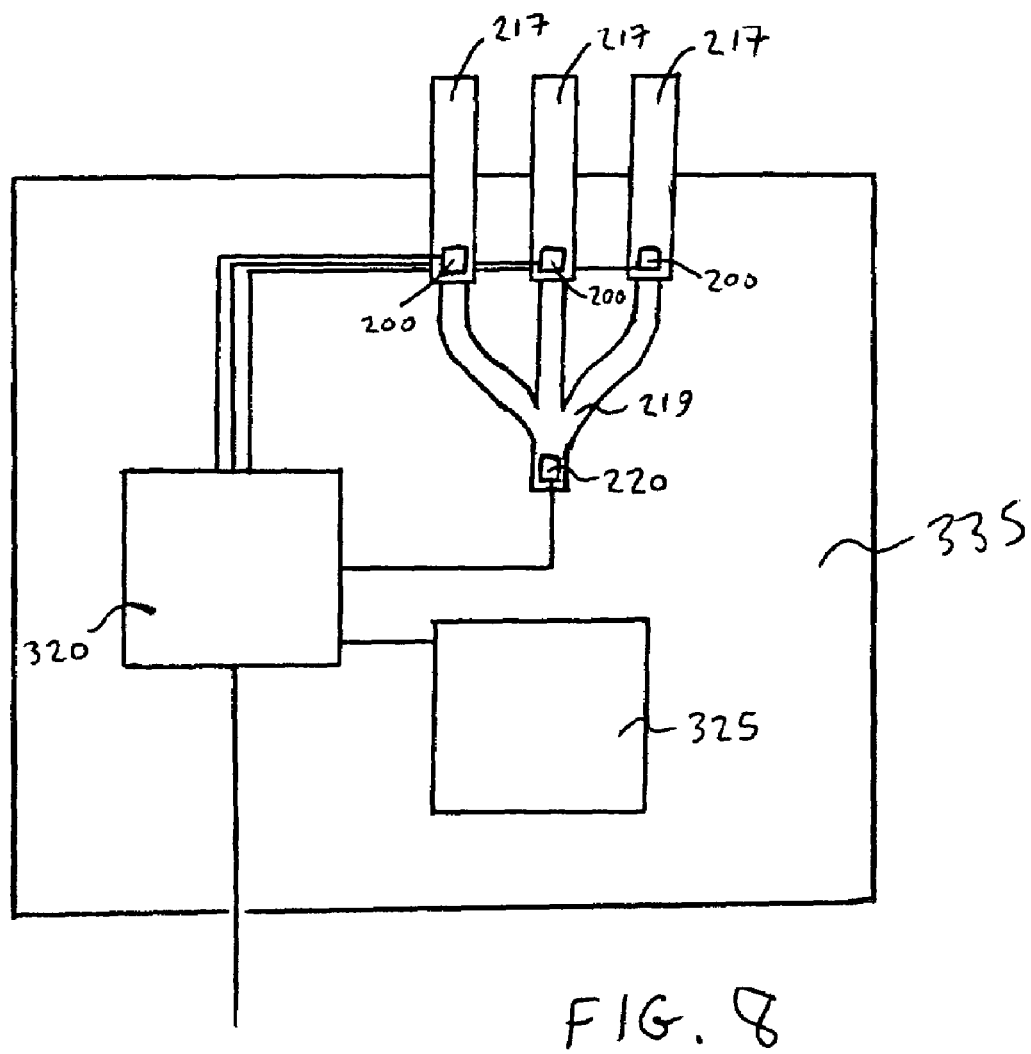
FIG. 8 shows an example of an indicator assembly.

An example of an indicator assembly is shown in FIG. 8. In this example, the indicator assembly includes a circuit board 335 (upon which the remaining components of the assembly may be mounted) and three LEDs 200 with respective light guides 217. A portion of light which is directed by each light guide is received by a photodetector 220 via a photodetector guiding portion 219. The LEDs 200 and photodetector 220 can be connected to an I2C bus via the I2C interface 320 through which control and monitor signals may be received. Where the indicator assembly is configured as a field replaceable unit, an I2C EEPROM 325 can be provided to store a FRU-ID. An indicator assembly according to this example may constitute one of the indicator assemblies 183 and/or 184 or may be incorporated into one or both of the of the PSUs, into one or more of the information processing cartridges 43 or may be included in one or both of the CSSPs 71. In each case, monitor and control functions for the assembly are provided by the SSP 74 (See FIG. 9) via the I2C interface 230.

Figure 9:
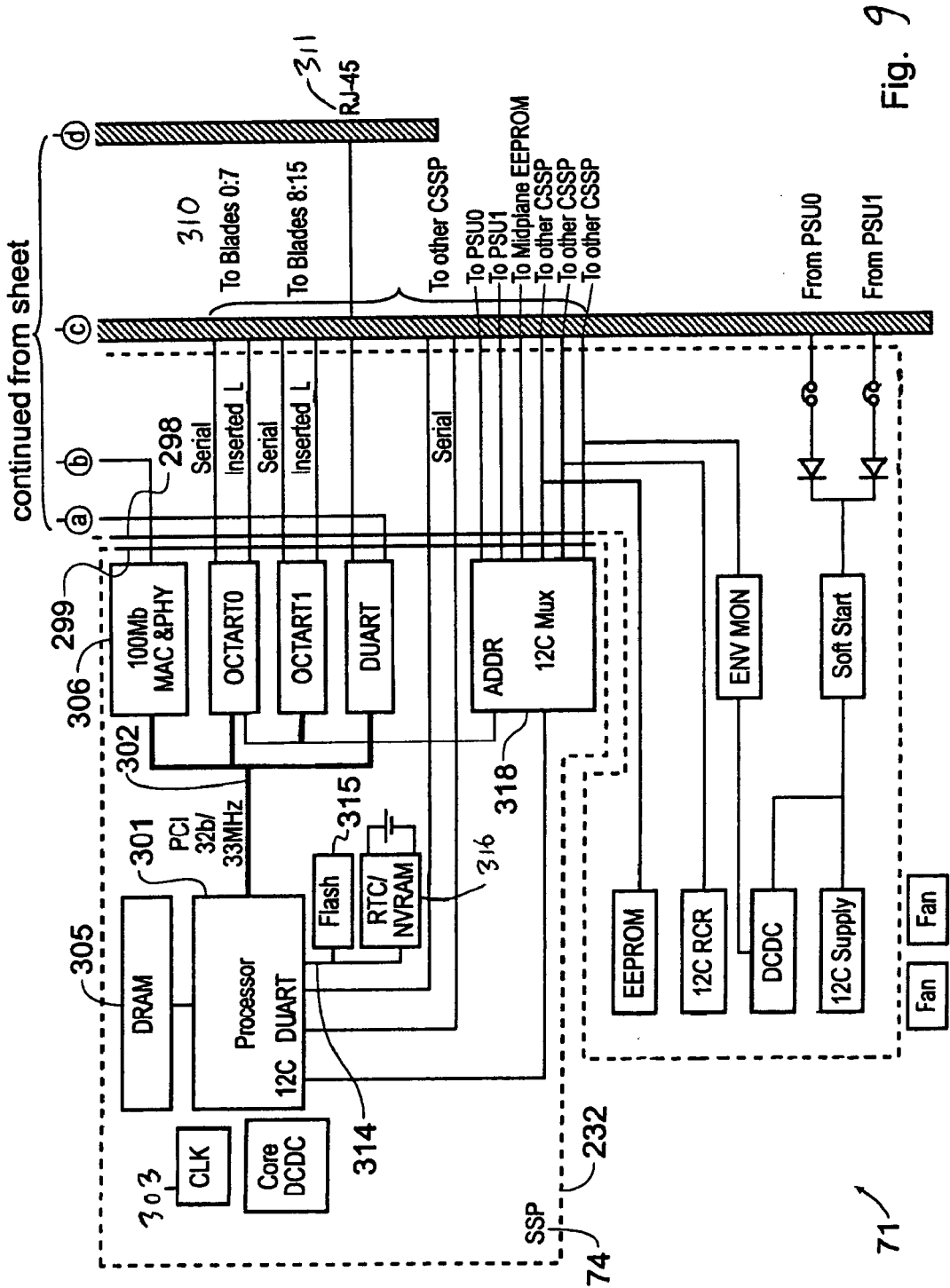
FIG. 9 is a functional block diagram of an example of an information processing subsystem for the combined switch and service processor module.

With reference to FIG. 9, there now follows a description of an example of a combined switch and service processor (CSSP) 71. In the present example, each CSSP 71 provides the functionality of a Switch 73 and of a Shelf Service Processor, or Shelf Service Processor (SSP) 74.

Figure 12:
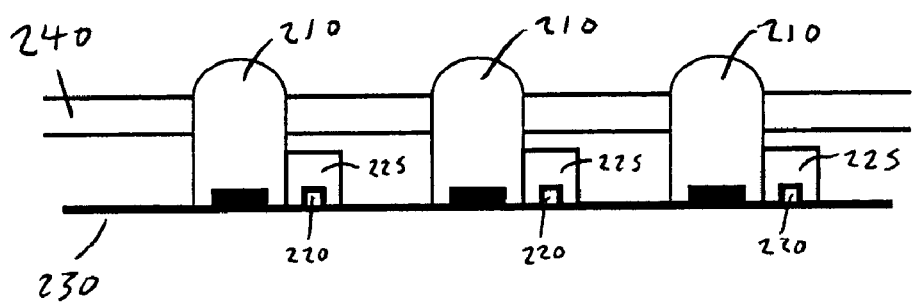
Figure 13:
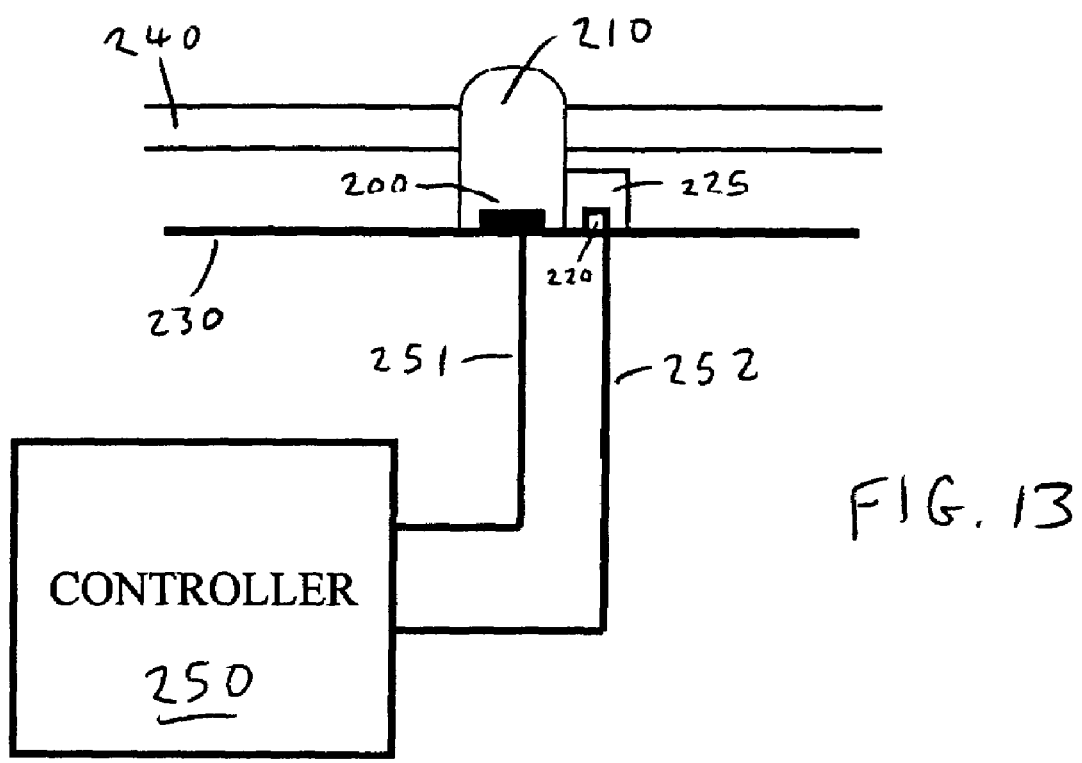

FIG. 9 provides an overview of the functional components of the CSSP 71 including functional components of the Switch 73 and functional components of the SSP 74. In the present example, most of the components relating to the Switch 73 are mounted on a Switch PCB 231, and the components relating to the SSP 74 are provided on a SSP PCB 232. However, it should be noted that the components located in the lower portion of the switch PCB 231 (i.e., that portion below the SSP PCB 232 as illustrated in FIG. 12) logically belong to the SSP 74, rather than to the switch 73. It will be appreciated that such component arrangements are not compulsory for successful operation and that any other component arrangement over any number of component boards can be easily achieved using conventional component arrangement techniques.

With reference to FIG. 9, there now follows a description of functional elements of the Shelf Service Processor (SSP) portion 74 of a CSSP 71 as contained within the CSSP enclosure and provided on an SSP PCB 232.

In the present example, communication between the Switch PCB 231 and the SSP PCB 232 is facilitated by an interboard connector pair 298 and 299. It supports connections (pins) for I2C signals, 10/100 MAC/PHY output, and power. As described above, the switch PCB 231 carries the components associated with the switch, and it also carries the power, FRU-ID and environmental monitoring components along with the connectors for connections to the midplane 171 and external connectors. Thus, in the present example, all SSP components requiring a connection to the midplane 171 or an external connection have signal paths routed through the connector pair 298, 299 and via the switch PCB 231 to the relevant midplane or external connectors.

In the present example, the SSP 74 includes a microprocessor 301 (e.g., a Power PC (MPC8245) processor) mounted on the SSP printed circuit board (PCB) 232. The processor 301 can be connected to a PCI bus 302, the present instance a 32 bit bus that operates, for example, at 33 MHz/66 MHz. A clock input to the processor 301 can be provided by a clock generator (CLK) 303. The processor 301 can be provided with a DRAM memory 305.

An integrated MAC/PHY switch 306 can provide its own interface to the PCI bus 302. The MAC/PHY switch 271 can be connected to 10/100 Ethernet hub 272 via the interboard connectors 298, 299. A loopback mode can be provided by the MAC/PHY switch 306 for system diagnostics.

Octal UARTs 308 and 309 can be connected between the PCI bus 302 and the interboard connector pair 298, 299. The signal path can be continued from the interboard connector pair 298, 299 to serial connections 310 on the midplane connector 141 on switch PCB 231. The Octal UARTS 308, 309 can facilitate serial communications between the SSP 74 and each of the processing cartridges 43.

Also connected to the PCI Bus 302 can be a dual UART (DUART) 312 that in turn can connect via the interboard connectors 298, 299 to serial bus 261 for providing an asynchronous console connection from the SSP 74 to the switch 73. The DUART 312 can also have an I2C connection to an external connector on the rear face 122 of the CSSP enclosure 121. The external connector can provide a common operating system/boot console and command port 311.

Connected to the processor 301 via an XBus 314 can be a Flash PROM 315. The Flash PROM 315 can store a real time operating system, and management and configuration data for the microprocessor 301. The Flash PROM 315 can be operable in the present example to hold up to 2 MB of data, depending on the software required.

To facilitate I2C communications between the SSP 74 and the other CSSP 71, the midplane 171 and the PSUs 81, a multiplexer 318 can be provided. The multiplexer 318 can have a single I2C connection to the processor 301 and connections, via the interboard connector pair 298, 299 and the midplane connector 141 to both PSUs 81, the midplane 171 and the other CSSP 71.

LED indicators 137 can be provided, for example with a green power LED, an amber LED for indicating that service is required and a blue LED for indicating that the switch is ready to be removed. LED indicators integrated on 2×4 stacked RJ45 connectors on the rear face of the CSSP 71 can be arranged, for example, to show green continually when the link is present and flash green when the link is active.

The SSP 74 can access the I2C devices (FRU-ID EEPROM, 8-bit I/O expansion chip, and the system hardware monitor) through the midplane 171.

A number of alternative types of indicator assembly will now be described in more detail. The indicator assemblies described below are suitable for incorporation into the rack mountable computer system described above but may also be incorporated into other computers systems or electrical equipment in which indicator lights are to be provided.

Figure 10:
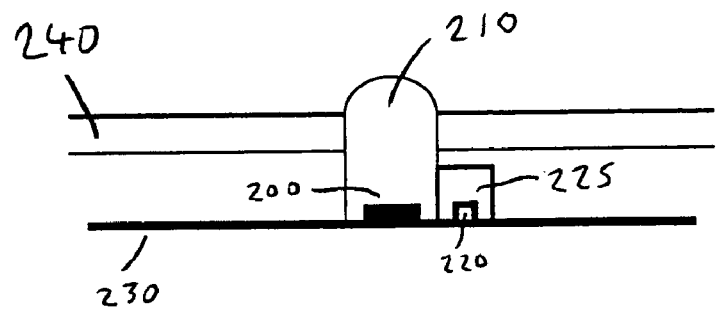
FIGS. 10 to 13 each show examples of indicator assemblies.
Figure 11:
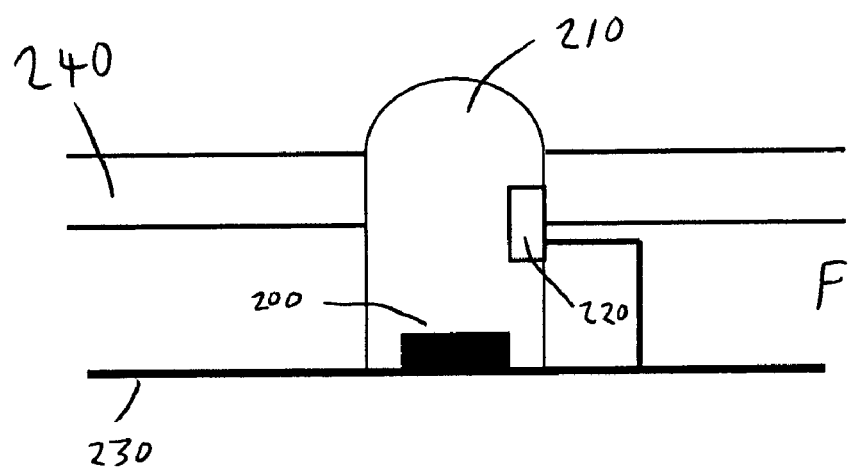

FIG. 10 shows an example of an indicator assembly which accommodates a single indicator light. Provided in an exterior panel 240 of a computer system is an aperture partially located within which is a light guide. A light source 200 is also provided and the light guide is configured to direct light emitted by the light source 200 to the exterior panel 240. In the examples shown in FIGS. 10, 11, 12 and 13 the light guide comprises a cap 210 of an LED in which a light source 200 is also incorporated. Other examples of light guides are described below. The light guide may be formed from a transparent or translucent material such as a plastics material. In the present example, the light source 200 and light guide 210 are mounted on a circuit board 230. A photodetector 220 can be positioned adjacent to or abutting the light guide and can thereby receive a portion of the light which is directed by the light guide. In order to direct light which is transmitted by the cap 210 into the photodetector 220, a photodetector guiding portion 225 may be provided. The photodetector guiding portion 225 may be comprised of any material through which light may be transmitted, such as a transparent or translucent plastics material or glass. The photodetector guiding portion 225 may also serve to prevent light other than that which is transmitted by the cap 210 from being received at the photodetector 220. The photodetector guiding portion 225 may be separate from the cap 210 and positioned such that it abuts the cap 210 to receive light therefrom. Alternatively, the photodetector guiding portion 225 may be formed integrally with the cap 210. While in the present example, the photodetector 220 is mounted upon the circuit board 230, the photodetector 220 may alternatively be otherwise mounted. For example, the photodetector 220 may be mounted on an inner surface of the exterior panel 240 or within the exterior panel 240 itself. Furthermore, one or more photodetectors may be embedded within the light guide itself. An example of such a configuration is shown in FIG. 11. By embedding the photodetector 220 within the light guide, a mounting for the photodetector is provided and the photodetector may be better positioned to receive light directed by that light guide. Embedding one or more photodetectors within lights guides such as any of those shown in FIGS. 5 and 8 to 11 for example is envisaged.

The photodetector 220 may for example comprise a photodiode or any component which is operable to measure characteristics of light such as intensity and/or wavelength. In use, the photodetector 220 detects the light which it receives and produces a signal (such as one or more electrical voltage levels) indicative of the detected light. For example, the photodetector 220 may produce a signal which is indicative of the intensity of the detected light. As an alternative, where the photodetector is sensitive to the wavelength of the light which it detects, the photodetector may produce a signal indicative of the detected wavelength. Additionally, the photodetector 220 may be operable to produce a signal indicative of both the intensity and wavelength of the detected light. In some cases, more than one photodetector may be provided, each photodetector being operable to produce a signal corresponding to a given characteristic of the light which it receives. For example, where it is required that the color of the light being directed by a light guide be determined, then three photodetectors can be provided, each being operable to determine the intensity of light of one of the primary colors directed by the light guide. By combining the signals produced by each photodetector, the color of the light would be ascertainable. A separate photodetector may be provided to detect the overall intensity of the light in the light guide.

In order to ensure that the photodetectors described herein do not receive stray light from neighboring light guides, indicator light sources or indeed from any further components which may be situated nearby, shielding may in some examples be provided. Such shielding can act to block out stray light and prevent it from contaminating the light received by the photodetector. For instance, in the example shown in FIG. 10, one or more outer surfaces of the photodetector guiding portion 225 can be coated with an opaque material such that only light which originates from the cap 210 can enter the guiding portion.

The photodetector 220 can produce a signal which is indicative of the light which is directed by the light guide and that signal may be evaluated in order to determine whether faults associated with the light guide and/or the light source 200 are present.

Various types of faults may occur which the assembly is able to detect. For instance, a fault may include a malfunction in the light source 200 whereby the light source 200 fails to illuminate when power is supplied thereto. In such cases, the photodetector 220 will detect the absence of light within the light guide and produce a signal indicative of the lack of light.

Another fault which is detectable may arise where the light guide has become loose and/or is mispositioned. If the light guide is mispositioned, the photodetector 220 may receive a lesser portion of light (or indeed, no light at all) from the light guide and the signal produced by the photodetector 220 may reflect this.

A further type of fault involves the absence of the light guide and/or light source 200 altogether. For example the light guide and/or light source have not have been installed or may have become detached from their mountings. The absence of the light guide and/or light source 200 may again be detected by the photodetector 220 as a lack of light and an appropriate signal may be produced.

A further type of fault may involve a light source 200 producing light of the wrong color or wavelength. Such a fault may arise due to a malfunction in the light source 200 whereby the light emitted is discolored or alternatively due to the wrong type (color) of light source having been installed. A similar type of fault can arise where the light guide 210 itself acts as a filter to produce light of substantially one color (an example of such an arrangement is an LED with a colored plastic cap). Such arrangements give rise to the possibility that the wrong color light guide has been installed. To detect these kinds of fault, a wavelength sensitive photodetector may be provided to detect that the light directed by the light guide is of a certain color and produce a signal which is indicative of that color. Where the color differs from the color which is the intended color, the signal produced by the photodetector will differ from an expected signal and the presence of a color fault can thereby be detected. It will be clear from what has been described above that such color sensitive photodetectors may also be operable to detect non-wavelength related faults such as intensity faults.

The indicator assembly may be configured to accommodate more than one light source in accordance with design requirements. An example of such an arrangement is shown in FIG. 12. The assembly shown in FIG. 12 comprises three light guides, each of which directs light from a respective light source 200 to the exterior panel 240. Three photodetectors 220 are provided and each is positioned to receive light from a respective one of the light guides via a respective photodetector guiding portion 225. Accordingly, each photodetector 220 can produce a signal which is indicative of the light which is directed by a respective light guide. Faults associated with each respective light guide 210 and/or the associated respective light sources 200 may thereby be detected.

The signal which is produced by the photodetector 220 can be provided to other components for evaluation. For example, as shown schematically in FIG. 13, the signal may be provided to a controller via, for example a control line 252. Such components can evaluate the signal to determine whether the signal is consistent with the presence of a fault. For example, where the signal comprises one or more voltage levels, those voltage levels can be evaluated. The evaluation may involve a comparison of the signal with an expected signal using appropriate circuitry, whereby the deviation of the signal from the expected signal may be lead to the conclusion that a fault is present. The component or components may, for example, be provided in vicinity of the assembly (for example they may be mounted upon the circuit board 230) or alternatively may be comprised in other parts of the computer system.

Components operable to control the operation of the light source or light sources may be provided. As with the components configured to receive signals from the photodetector/s, these components may be located locally, such as on the circuit board 230 or alternatively may be provided elsewhere in the computer system.

In one example, the components which receive signals from the photodetector/s and which control the operation of the light sources 200 can be incorporated into a controller which again can be provided either locally to the assembly or elsewhere in the computer system. Referring once more to the example shown in FIG. 13 for instance, the controller 250 may be operable to control the operation of the light source 200 by asserting a control signal via control line 251. The control signal may comprise activate/deactivate signals such as those described below.

In some examples, a controller or equivalent components may be operable to alter the operation of the light sources 200 to remedy a detected fault. For example, where the photodetector/s are operable to detect an intensity of a received portion of light, a controller may assert a signal to cause the indicator light to increase/decrease the intensity of the light outputted therefrom to compensate for a detected intensity decrease/increase. In another example, where a wavelength of the received light is detectable at the photodetector, and where the light source is operable to change the color of the light emitted thereby, a controller may assert a signal to cause the light source to change its output and compensate for a discoloring of the emitted light. These features find use in cases where lights sources are prone to a varying of their output characteristics (e.g. intensity, wavelength) over a period of time for given set of operating conditions (such as an input voltage). A deviation in the output characteristic of a light source caused by aging of the light source or by a change in operating temperature for example may therefore be compensated for.

In the rack mountable computer system described above, the relevant components may be incorporated into either of the CSSPs 71 whereby either of the CSSPs 71 would be operable to detect and produce indications of faults based upon signals received from the photodetectors and also to control the light sources by asserting the appropriate active/deactivate signals during a test cycle as is described below. In the system described above, the control and monitor functions can be performed by the processor 310 of the SSP 74. The control and monitor lines discussed in relation to FIG. 13 may be incorporated into one or more I2C connections connected to the multiplexer 318 (see FIG. 9).

In another example which may be incorporated into the rack mountable system described above, the Blade Service Controller 203 of each information processing cartridge 43 may be operable to control the indicators 169 of each respective cartridge 43. Referring once more to FIG. 4, the Blade Service Controller 203 may be operable to assert activate/deactivate signals such as those described below to the LEDs 169 via the Bit I/O of that Blade Service Controller 203. Similarly, the Blade Service Controller 203 may receive signals from one or more photodetectors 220 comprised in the indicator assembly of that cartridge 43 via the bit I/O. The Blade Service Controller may thereby be operable to determine the presence of faults, to produce indications of determined faults and to perform test cycles such as those described below.

By controlling the operation of each light source 200, it is possible to test each light source at a time which is convenient, for example where a user has indicated that a test procedure should be initiated. Furthermore since, during normal operation, a light source may not be permanently illuminated, a lack of light received by the photodetector may simply indicate an off-state in the light source as opposed to a fault. Similarly, where an indicator light is operable to emit more light of alternative wavelengths, it is necessary that the signal produced by photodetector at any given time corresponds to the color of light which is being tested for. By controlling the operation of each light source, a convenient test procedure may be arranged in which each of the desired characteristics such as light intensity and/or color can be tested in a controlled manner.

A number of example test procedures/cycles will now be described in relation to FIGS. 14 and 15. These test procedures may for example be carried by a controller such as that shown in FIG. 13, by one of the CSSPs 71 of the rack mountable computer system described above, or by a Blade Service Controller 203 as described in relation to FIGS. 3 and 4.

Figure 14:
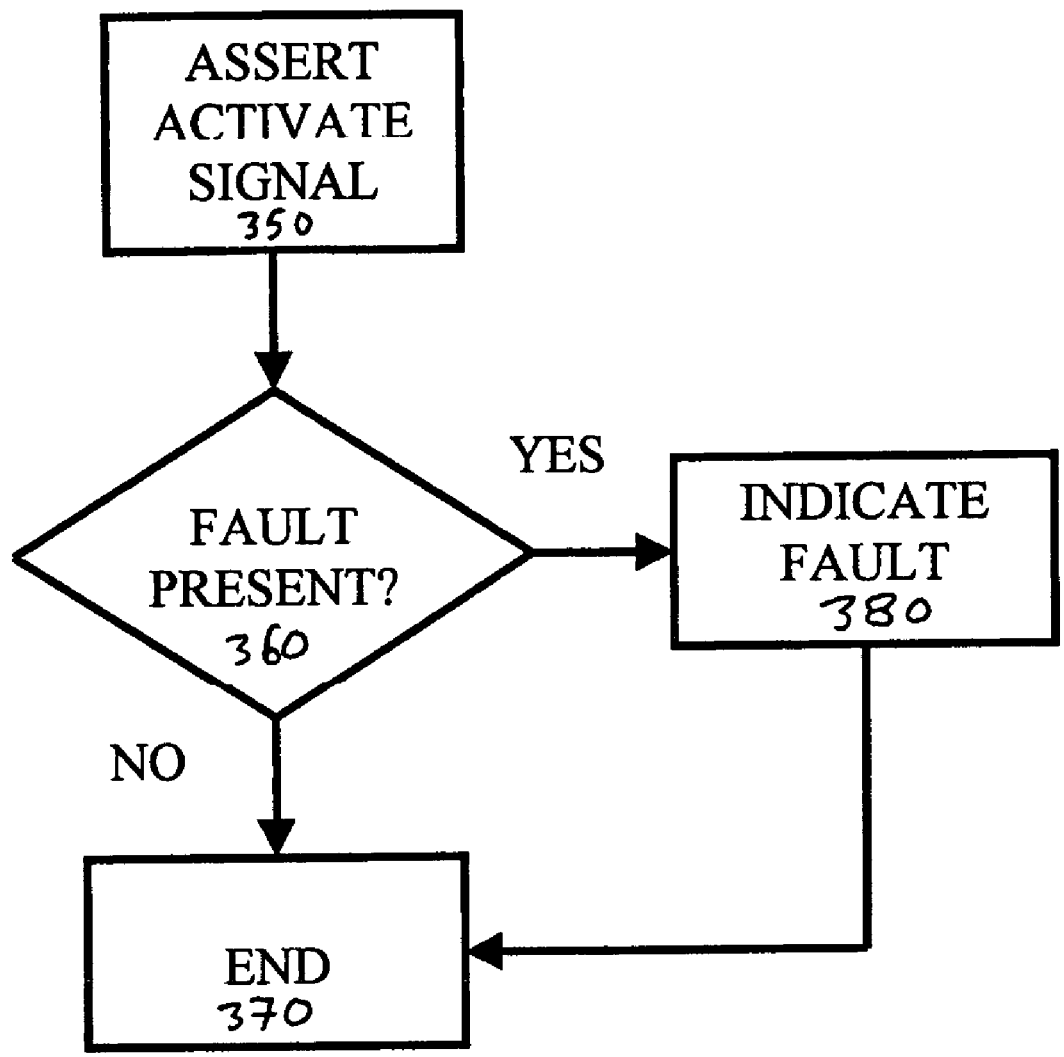
FIG. 14 shows a test cycle for testing for faults in an indicator light.

FIG. 14 shows a flow chart illustrating a test cycle for testing a single indicator light (see, for example, FIG. 10). In this example, the test cycle begins at step 350. In order that it be ensured that the light source to be tested is illuminated, or at least that that light source should in the absence of a fault be illuminated, an activate signal is asserted to the light source. The activate signal can be asserted by the components described above, such as a controller or a CSSP 71 or a Blade Service Controller 203 in the case of the rack mountable computer system described above. At step 360, it may then be determined, based upon the signal produced by the photodetector 220 whether a fault is present. Step 360 may in fact comprise a number of separate steps during which different characteristics of the light such as intensity and wavelength are tested. If it is determined that no fault is present, the test cycle can end at step 370. However, if at step 360 it is determined that a fault is present, an indication of the fault, for example to alert a user to the faults presence, may be produced at step 380. After the fault has been indicated, the test cycle may end at step 370.

Figure 15:
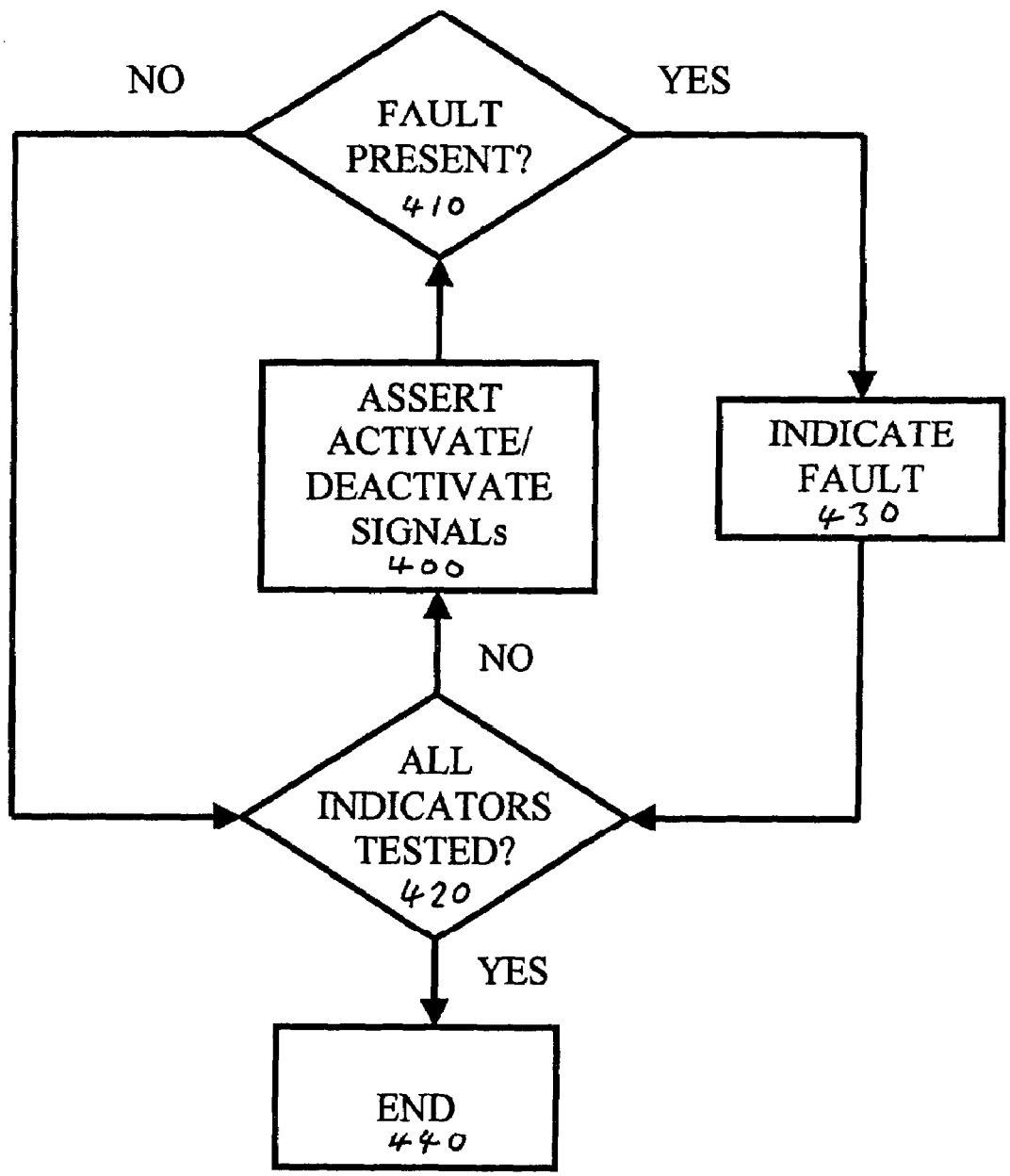
FIG. 15 shows a test cycle for testing for faults in a plurality of indicator lights.

FIG. 15 shows a flow chart illustrating a test cycle suitable for testing a plurality of indicator lights (see, for example, FIG. 12). In this example, the test cycle begins at step 400. In accordance with test cycle, each light source 200 may be illuminated one at a time, tested and then deactivated. Alternatively, all of the light sources can be illuminated simultaneously for testing. Accordingly, at step 400 the appropriate activate/deactivate signals are asserted to those light sources which it is intended be activated (illuminated) or deactivated. At step 410, the first of the indicator lights is tested for faults. Again, this step may involve a number of separate steps in which various characteristics such as light intensity and light color are tested. If at step 410 it is determined that no fault is present, the cycle proceeds to step 420. Alternatively, if it is determined at step 410 that a fault is present, an indication of the fault can be produced at step 430. When the fault has been indicated, the test cycle can end or at least pause while the fault is dealt with. Alternatively, the test cycle can proceed immediately to step 420. Whether or not a fault has been detected at step 410, at step 420 it is determined whether all of the indicator lights have been tested for faults. If all of the indicator lights have in fact been tested, then the test cycle can end at step 440. Step 440 may involve asserting deactivate signals to each indicator light and/or returning those indicator lights to normal operation. However, if it is determined at step 420 that not all of the indicator lights have been tested, then the test cycle returns to step 400. In test cycles in which all of the indicator lights are illuminated simultaneously for testing, there is no need to assert any activate/deactivate signals at step 400 and the test cycle can proceed to step 410. However, in test cycles in which only a single indicator light is illuminated at a time, the appropriate activate/deactivate signals are asserted before the test cycle proceeds to step 410 and continues.

Further examples of indicator assemblies involving alternative configurations will now be described in relation to FIGS. 16 to 21.

Figure 16:
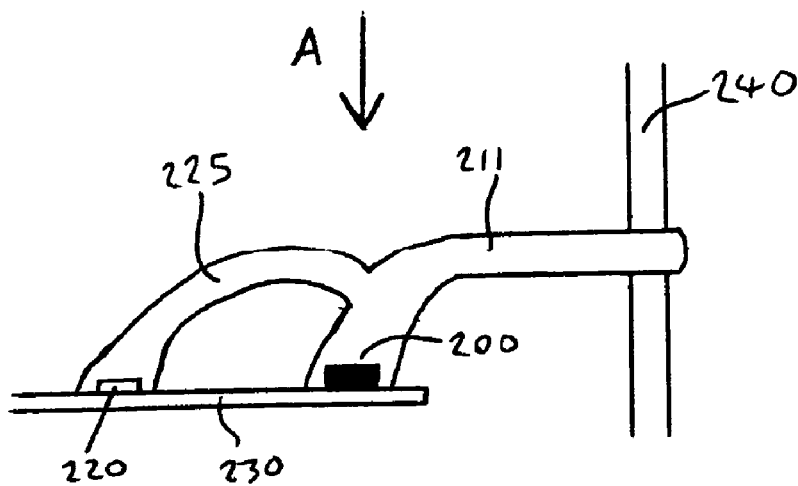
FIGS. 16 to 21 each show further examples of indicator assemblies.

FIG. 16 shows a view of an indicator assembly which comprises another example of a light guide. In this example, the indicator assembly comprises a circuit board 230 with a light source 200 and a photodetector 220 mounted thereon. Also mounted upon the circuit board 230 is a light guide which comprises a an extension piece 211 which can be used to guide light from the light source 200 to an external panel 240 of a computer system and photodetector guiding portion 225.

Figure 17:
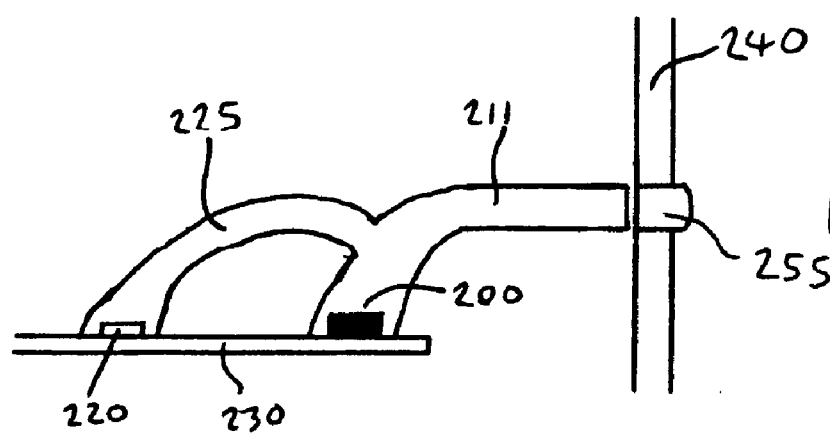

This form of light guide, namely a light guide comprising an extension piece, allows the light source 200 to be located remote from the external panel 240 in accordance with system requirements. The extension piece 211 may be clear or translucent and/or colored so as to pass light only of substantially a single color. The extension piece 211 can be partially located within an aperture in the exterior panel 240. In other examples, the light guide may comprise a separate plug piece 255 located substantially within the aperture in the exterior panel 240. An example of such a configuration is shown in FIG. 17. In such examples, the extension piece 211 may extend towards and/or abut the plug piece 255 such that light which is transmitted by the extension piece 211 can pass into the plug piece 255 and thereby be transmitted through the aperture. Each plug piece 255 may, in such examples, be configured to transmit light of substantially one color.

In the present example, the photodetector guiding portion 225 is formed integrally with the extension piece 211 and extends away from a position along the length thereof. In other examples the photodetector guiding portion 225 may be formed separately and positioned to abut the light guide 211 in one or more places to receive light therefrom. In either case, the angle at which the photodetector guiding portion 225 joins/abuts the light guide 211, and/or the cross section of the photodetector guiding portion 225 itself may be varied in order that a suitable portion of light be diverted from the light guide 211 and guided to photodetector 220.

In the present example, the light guide can be mounted on the circuit board 230 by attaching it to the light source 200 and/or photodetector 220. Alternatively, the light guide may be directly mounted to the circuit board 230 in a position which aligns the photodetector guide portion 225 and extension piece 211 with the photodetector 220 and light source 200 respectively. In either case, mounting may be achieved using a fastener, an interference fit, by adhesion or in any other suitable manner.

Figure 18:
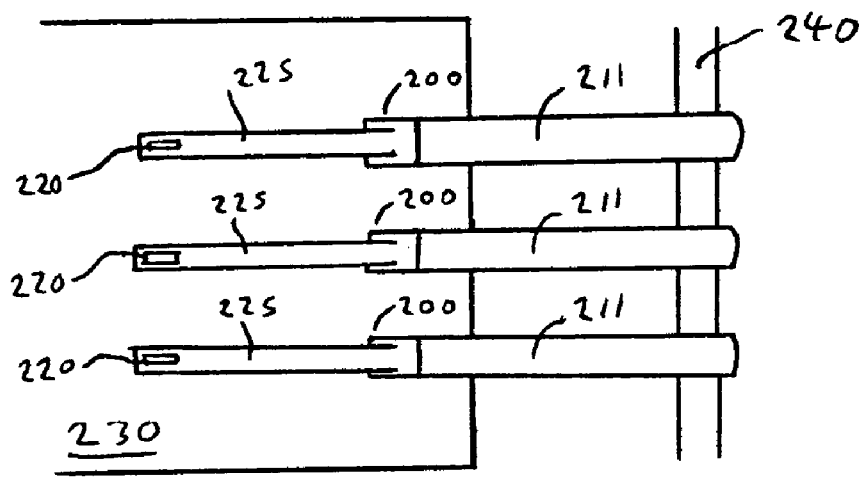

FIG. 18 shows an indicator assembly comprising three light sources 200, photodetectors 220 and light guides such as that shown in FIG. 16. In FIG. 18, the indicator assembly is shown from a different direction (indicated by arrow 'A' in FIG. 16) so as to further illustrate the configuration of the components involved. In the example shown in FIG. 18, the indicator assembly comprises three separate extension pieces 211, each of which directs light from a respective light source 200 (these are not shown in FIG. 18, but can be located in position corresponding to the position shown in the example of FIG. 16) to the exterior panel 240. In the present example, each extension piece may be colored so as to pass light of substantially one color. Extending from each extension piece 211 is a photodetector guide portion 225 for directing a portion of the light directed by that light guide 211 to a respective photodetector 220.

Figure 19:
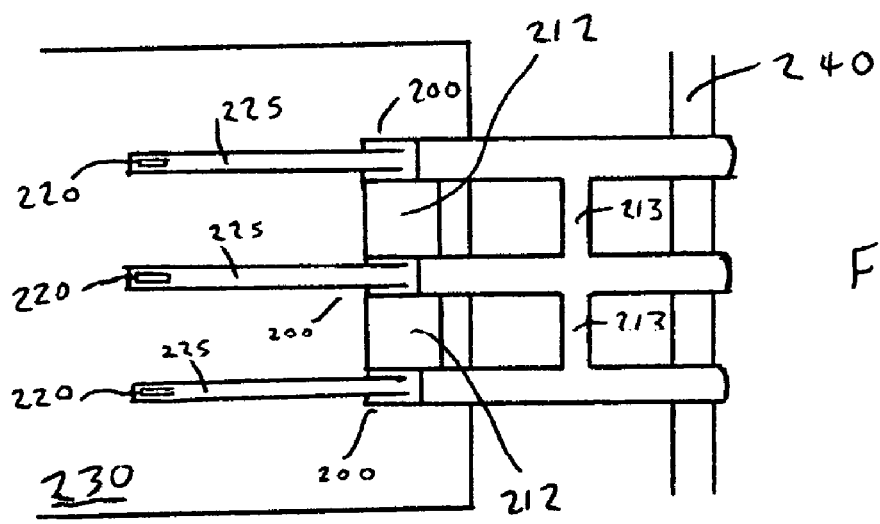

While in the example shown in FIG. 18, separate extension pieces 211 are used, these extension pieces 211 may be physically attached to each other to form a single unit. An example of such a configuration is shown in FIG. 19. In FIG. 19, each extension piece 211 is joined to a neighboring extension piece 211 by joining portions 213. Also, the light guide can comprise a base portion 212 from which each of the extension pieces 211 extends. The base portion 212 and the joining portions 213 can attach the extension pieces 211 to each other and thereby provide additional support for the light guide. The risk of the extension pieces 211 becoming dislodged is thereby reduced. The base portion 212 and the joining portions 213 can be formed integrally with the extension pieces 211 and thereby comprise the same construction material. Where a base portion 212 is provided, that base portion 212 may comprise cavities for accommodating the light sources 200. In such cases, each extension piece may be configured to extend away from a respective cavity. The photodetector guide portions 225 may also extend from the base portion 212 and the base portion 212 may in such cases also comprise cavities to accommodate the photodetectors 220.

Figure 20:
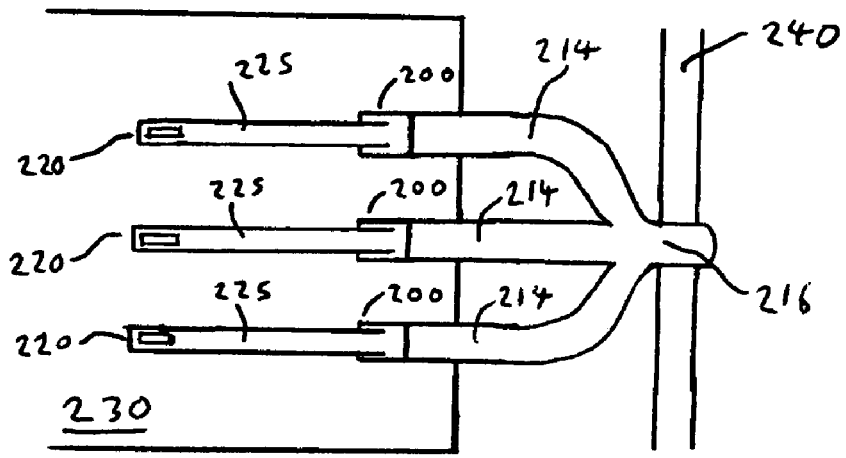

An indicator assembly comprising a further type of light guide is shown in FIG. 20. This type of light guide can direct light from more than one light source through a single aperture in the exterior panel 240. In the present example, the light guide is configured to direct light from three light sources 200 and accordingly can comprise three extension pieces 214, each extension piece 214 being positioned to collect light from a respective light source 200. Each of the extension pieces 214 converge to form a single channel 216 which can be partially located within the exterior panel 240. Alternatively, the channel 216 may extend towards a plug piece located substantially within an aperture in the panel 240 as described above.

Light guides which direct light from multiple light sources may be provided, for example, where the light sources 200 are each configured to provide light of a different color. In this manner, the color emitted by the indicator light, can be changed by illuminating the appropriate light source 200.

In examples in which a light guide configured to direct light from more than one light source for a single indicator light is provided, a test cycle can be employed which can be similar to that described in relation to FIG. 15. Referring once more to FIG. 15, the test cycle can begin at step 400. In accordance with test cycle, each light source 200 may be illuminated and then tested one at a time and while the remaining light sources are not illuminated. Accordingly, each light source and its associated portion of light guide comprising a respective extension piece 214 can be tested independently of the remaining light sources. Accordingly, at step 400 the appropriate activate/deactivate signals are asserted to those light sources which it is intended be activated (illuminated) or deactivated. At step 410, the first of the light sources is tested for faults. This step may involve a number of separate steps in which various characteristics such as light intensity and light color are tested. If, step 410, it is determined that no fault is present, the cycle can proceed to step 420. Alternatively, if it is determined at step 410 that a fault is present, an indication of the fault is produced at step 430. When the fault has been indicated, the test cycle can end or at least pause while the fault is dealt with. Alternatively, the test cycle can proceed immediately to step 420. Whether or not a fault has been detected at step 410, at step 420 it is determined whether all of the light sources have been tested for faults. If all of the light sources have in fact been tested, then the test cycle can end at step 440. Step 440 may involve asserting deactivate signals to each light source and returning them to normal operation. However, if it is determined at step 420 that not all of the light sources have been tested, then the test cycle returns to step 400. At step 400, the appropriate activate/deactivate signals are asserted and the test cycle proceeds to step 410 and continues.

Figure 21:
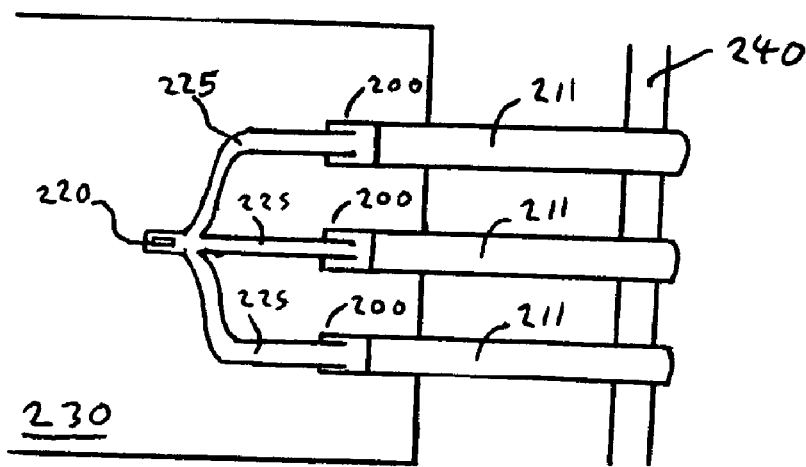

FIG. 21 shows an example of an indicator assembly comprising multiple light sources 200, but which comprises only a single photodetector 220. In this example, to facilitate the use of only a single photodetector 220, the light guide can comprise three photodetector guide portions 225 which converge to form a single guide from which a photodetector 220 can be positioned to receive light. Where photodetector guide portions 225 of this kind are used, testing of the light sources should be carried out on an individual basis (sequentially for example, with only one light source being illuminated at any one time and as described in relation to FIGS. 15 and 20 above). It is envisaged that photodetector guide portions 225 such as those described here could be incorporated into other examples of indicator assemblies which comprise multiple light sources (such as those described in relation to FIGS. 18 and 19 for example). The reduction in components afforded by the provision of only a single photodetector and a converging photodetector 220 guide portion 225 can reduce the overall complexity of the assembly and can thereby reduce production costs and potential for malfunctions.

In each of the examples described above, each photodetector may be provided with a respective filter or filters configured to pass light of substantially one color. For example, each filter may be tuned to filter out light wavelengths which are not associated with the light source or light sources comprised in the indicator assembly. Each photodetector may thereby produce a more accurate signal since stray light (of the 'wrong' wavelength which originates from outside the assembly) can be prevented from being detected by the photodetector.

Filters may also serve to enable verification of the correct color of light source having been installed. For example, a filter can positioned to filter light emitted by a respective light source, such that only light having a wavelength substantially equal to an expected wavelength (namely the wavelength which it is intended that the respective light source emit) is received at a photodetector. Accordingly, were for example the wrong color of light source to have been installed, little or no light would arrive at the photodetector (since the 'wrong' color of light would not be passed by the filter) and the signal produced by the photodetector would be indicative of the presence of a fault.

Such examples could be implemented by positioning a filter in a cap of a photodetector. Alternatively, one or more filters may be incorporated into a photodetector guide portion. For example, a filter element may be embedded in a photodetector guide portion or alternatively the guide portion may itself be colored to pass light of substantially one color. In indicator assemblies such as that shown in FIG. 11 (i.e. which are configured to direct light from multiple light sources to a single photodetector) each photodetector guide portion 225 could be provided with a filter of the appropriate color, the filter being positioned along the length of a respective guide portion 225 but away from the point at which the multiple guide portions 225 converge to form a single guide. The photodetector would thereby be able to verify that each of the light sources 200 were of the correct color.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An indicator assembly comprising:
    a light guide configured to direct light from an indicator light source;
    a photodetector configured to receive a portion of the light directed by the light guide to produce a signal representative of said portion of light, wherein the photodetector is further configured to detect an intensity and a wavelength of the light which it receives from the light guide; and
    a controller configured to receive the signal, wherein the controller is further configured to determine from the received signal a deviation from an expected intensity or wavelength of the light directed by the light guide and to assert a control signal to the indicator light source to alter a light output thereof to compensate for the deviation.

2. The indicator assembly of claim 1, wherein the controller is configured to determine whether intensity or wavelength faults are present, and wherein the controller is further configured to produce an indication of whether a fault is an intensity fault or a wavelength fault.

3. The indicator assembly of claim 1, comprising:
    a plurality of light guides configured to direct light from a respective one of a plurality of indicator light sources; and
    a plurality of photodetectors each configured to receive a portion of the light directed by a respective light guide to produce a respective signal representative of said respective portion of light.

4. The indicator assembly of claim 1, comprising:
    a light guide configured to direct light from each of a plurality of indicator light sources; and
    a photodetector configured to receive a portion of the light directed by the light guide to produce a signal representative of said portion of light.

5. The indicator assembly of claim 1, wherein the light guide comprises a cap of a light emitting diode (LED).

6. An indicator control apparatus, the apparatus comprising:
    a light guide configured to direct light from an indicator light source;
    a photodetector configured to receive a portion of the light directed by the light guide to produce a signal representative of said portion of light, wherein the photodetector is configured to detect at least one of a wavelength and an intensity of the light which it receives from the light guide; and a controller configured to receive the signal, wherein the controller is configured to determine from the received signal a deviation from an expected intensity or wavelength of the light directed by the light guide and to assert a control signal to the indicator light source to alter a light output thereof to compensate for the deviation.

7. The indicator control apparatus of claim 6, wherein the controller is operable to determine whether the signal is consistent with the presence of a fault.

8. The indicator control apparatus of claim 6, wherein the controller is operable to produce an indication of a determined fault.

9. The indicator control apparatus of claim 8, wherein the indication of the fault is an audible or a visual indication.

10. The indicator control apparatus of claim 6, wherein the controller is operable to assert an activation control signal or a deactivation control signal to the light source to activate or deactivate the light source respectively.

11. The indicator control apparatus of claim 6, wherein the photodetector is operable to detect an intensity and a wavelength of the light which it receives from the light guide and wherein the controller is operable to determine whether intensity or wavelength faults are present.

12. The indicator control apparatus of claim 11, wherein the controller is operable to produce an indication of whether a fault is an intensity fault or a wavelength fault.

13. An indicator control apparatus, the apparatus comprising:
  a plurality of light guides configured to direct light from a respective one of a plurality of indicator light sources;
  a plurality of photodetectors each configured to receive a portion of the light directed by a respective one of the plurality of light guides to produce a respective signal representative of said respective portion of light; and
  a controller configured to receive the respective signal, wherein the controller is further configured to determine from the received signal a deviation from an expected intensity or wavelength of the light directed by the respective light guide and to assert a control signal to the respective indicator light source to alter a light output thereof to compensate for the deviation.

14. An indicator control apparatus, the apparatus comprising:
  a light guide configured to direct light from each of a plurality of indicator light sources;
  a photodetector configured to receive a portion of the light directed by the light guide to produce a signal representative of said portion of light; and
  a controller configured to receive the signal, wherein the controller is further configured to determine from the received signal a deviation from an expected intensity or wavelength of the light directed by the light guide and to assert a control signal to at least one of the indicator light sources to alter a light output thereof to compensate for the deviation.

15. The indicator control apparatus of claim 6, wherein the light guide comprises a cap of a light emitting diode (LED).

16. A computer system comprising an indicator assembly, the indicator assembly comprising:
  a light guide configured to direct light from an indicator light source;
  a photodetector configured to receive a portion of the light directed by the light guide to produce a signal representative of said portion of light, wherein the photodetector is further configured to detect an intensity and a wavelength of the light which it receives from the light guide; and
  a controller configured to receive the signal, wherein the controller is further configured to determine from the received signal a deviation from an expected intensity or wavelength of the light directed by the light guide and to assert a control signal to the indicator light source to alter a light output thereof to compensate for the deviation.

17. A circuit board comprising an indicator light source, a light guide, a photodetector, and a controller, wherein the light guide is configured to direct light from the indicator light source, wherein the photodetector is configured to receive a portion of the light directed by the light guide to produce a signal representative of said portion of light, wherein the photodetector is further configured to detect an intensity and a wavelength of the light which it receives from the light guide, wherein the controller is configured to receive the signal, and wherein the controller is further configured to determine from the received signal a deviation from an expected intensity or wavelength of the light directed by the light guide and to assert a control signal to the indicator light source to alter a light output thereof to compensate for the deviation.

18. A method for testing for faults in an indicator assembly, the method comprising:
  directing light from an indicator light source using a light guide;
  receiving at a photodetector a portion of the light directed by the light guide to produce a signal representative of said portion of light;
  detecting at the photodetector an intensity and a wavelength of the light which it receives from the light guide;
  receiving the signal at a controller; and
  determining from the received signal a deviation from an expected intensity or wavelength of the light directed by the light guide and asserting a control signal to the indicator light source to alter a light output thereof to compensate for the deviation.

19. A method for testing for faults in an indicator assembly, the method comprising:
  directing light from a plurality of indicator light sources using a plurality of respective light guides;
  receiving at a respective photodetector a respective portion of the light directed by a respective light guide to produce a respective signal representative of said respective portion of light;
  receiving the respective signal at a controller; and
  determining from the received signal a deviation from an expected intensity or wavelength of the light directed by the respective light guide and asserting a control signal to at least a respective one of the plurality of indicator light sources to alter a light output thereof to compensate for the deviation.

20. A method for testing for faults in an indicator assembly, the method comprising:
  directing light from each of a plurality of indicator light sources to an exterior panel of a computer system using a light guide;
  receiving at a photodetector a portion of the light directed by the light guide to produce a signal representative of said portion of light;

receiving the signal at a controller; and determining from the received signal a deviation from an expected intensity or wavelength of the light directed by the light guide and asserting a control signal to at least one of the indicator light sources to alter a light output thereof to compensate for the deviation.

21. The indicator control apparatus of claim 13, wherein the controller is configured to perform a test cycle including asserting an activate signal to each of the light sources and determining whether each respective signal representative of said respective portion of light is consistent with the presence of a fault.

22. The indicator control apparatus of claim 14, wherein the controller is operable to perform a test cycle including:
  (A) asserting an activate signal to one of the indicator light sources and asserting a deactivate signal to the remaining light sources;
  (B) determining whether the signal representative of said portion of light is consistent with the presence of a fault; and
  (C) repeating steps A and B until each of the indicator light sources has been tested in the test cycle.

23. The method of claim 19, further comprising performing a test cycle including:
  asserting an activate signal to each indicator light source to activate each of the light sources; and
  determining whether each of the signals representative of a respective portion of light is consistent with the presence of a fault.

24. The method of claim 20, further comprising performing a test cycle including:
  (A) asserting an activate signal to one of the indicator light sources and asserting a deactivate signal to the remaining light sources;
  (B) determining whether the signal representative of said portion of light is consistent with the presence of a fault; and
  (C) repeating steps A and B until each of the indicator light sources has been tested in the test cycle.

* * * * *